US008842470B1

(12) United States Patent
Yang et al.

(10) Patent No.: US 8,842,470 B1
(45) Date of Patent: *Sep. 23, 2014

(54) SYSTEM AND METHOD FOR CORRECTING SIGNALS READ FROM A MEMORY CELL OF A FLASH MEMORY

(75) Inventors: Xueshi Yang, Sunnyvale, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/479,909

(22) Filed: May 24, 2012

Related U.S. Application Data

(62) Division of application No. 12/194,133, filed on Aug. 19, 2008, now Pat. No. 8,189,381.

(60) Provisional application No. 60/968,474, filed on Aug. 28, 2007.

(51) Int. Cl.
*G11C 16/04* (2006.01)

(52) U.S. Cl.
USPC ............... 365/185.03; 365/191; 365/233.16; 365/233.17

(58) Field of Classification Search
USPC ................... 365/185.03, 191, 233.16, 233.17
See application file for complete search history.

(56) References Cited

U.S. PATENT DOCUMENTS

| 5,430,771 | A  | * | 7/1995  | Fix et al. ...................... 375/354 |
| 6,279,133 | B1 |   | 8/2001  | Vafai et al. |
| 6,501,812 | B1 |   | 12/2002 | Yada |
| 7,328,315 | B2 | * | 2/2008  | Hillier et al. .................. 711/149 |
| 7,535,787 | B2 | * | 5/2009  | Elmhurst et al. .............. 365/222 |
| 7,562,269 | B2 | * | 7/2009  | Yoshida et al. ............... 714/719 |
| 7,694,093 | B2 | * | 4/2010  | Shaw et al. ................... 711/162 |
| 7,725,750 | B2 | * | 5/2010  | Ashish et al. ................. 713/323 |
| 7,949,908 | B2 | * | 5/2011  | Yoel et al. .................... 714/710 |
| 8,189,381 | B1 | * | 5/2012  | Yang et al. ................ 365/185.03 |
| 2007/0067704 | A1 |  | 3/2007  | Altintas et al. |
| 2007/0171730 | A1 |  | 7/2007  | Ramamoorthy et al. |

FOREIGN PATENT DOCUMENTS

| GB | 2 418 820 A | 4/2006 |
| WO | WO2007/132453 A | 11/2007 |

OTHER PUBLICATIONS

The International Search Report and the Written Opinion of the International Searching Authority, or the Declaration mailed Mar. 3, 2009 for International Application No. PCT/US2008/07 4414 filed Aug. 27, 2008; 13 pages.

* cited by examiner

Primary Examiner — Pho M Luu

(57) ABSTRACT

A memory control module includes a read module configured to receive a first signal read from a first storage region of a memory cell, and receive a second signal read from a second storage region of the memory cell. A data detection module is configured to, based on a noiseless signal, detect respective data in each of the first storage region and the second storage region. The noiseless signal includes an ideal signal and an interference signal associated with at least one of the first signal and the second signal.

20 Claims, 14 Drawing Sheets

SYSTEM AND METHOD FOR CORRECTING SIGNALS READ FROM A MEMORY CELL OF A FLASH MEMORY

CROSS-REFERENCE TO RELATED APPLICATIONS

This application is a divisional of U.S. patent application Ser. No. 12/194,133 filed on Aug. 19, 2008 (now U.S. Pat. No. 8,189,381), which claims the benefit of U.S. Provisional Application No. 60/968,474, filed on Aug. 28, 2007. The disclosures of the above applications are incorporated herein by reference in their entirety.

FIELD

The present disclosure relates to memory systems, and more particularly to reading data in flash memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Non-volatile memory devices include an array of memory cells that store information. The memory cells are non-volatile in that they can retain the stored information even when not powered. Examples of non-volatile memory devices include read-only memory (ROM), flash memory, computer storage devices, such as hard disk drives, and optical disc drives.

Non-volatile memory devices may include multi-bit cell configurations. For some multi-bit cell configurations, each memory cell may have more than one storage region and each storage region may store one or more bits of data.

Referring now to FIG. 1, an exemplary memory cell 102 includes a transistor having a substrate 103, control gate 104 and a charge storage region 106. The substrate 103 may have a first region 105$a$, which may include a source or a drain, and a second region 105$b$, which may include a source or a drain. The charge storage region 106 may include a floating gate, an insulated layer, or various other configurations. Electrons that are placed on the charge storage region 106 may be trapped there because the charge storage region 106 is electrically isolated from the control gate 104 by an insulating layer (not shown). Multi-level cell configurations may be created by storing various quantities of charge on the charge storage region.

Referring now to FIG. 2, a block diagram of an exemplary memory system 113 is shown. The memory system 113 includes an array 107 of memory cells 102, a bit line decoder 116, a word line decoder 118, and a control module 120. The array 107 includes M rows and N columns of (M*N) memory cells 102. The bit line decoder 116 selects one of N columns of memory cells 102 via bit lines 108. The word line decoder 118 selects one of M rows of memory cells 102 via word lines 112.

The control module 120 may include an address control module 122 and a read/write (R/W) control module 124. The address control module 122 may control addressing of the memory cells 102 via the bit line decoder 116 and the word line decoder 118. The R/W control module 124 may control R/W operations of the memory cells 102 via the bit line decoder 116 and the word line decoder 118.

The R/W control module 124 may execute a read cycle to access data stored in the memory cells 102. During each read cycle, the R/W control module 124 may access memory cells 102 by applying voltages to the control gates 104 via the corresponding word lines 112. Each of the voltages may correspond to a different storage region. For example, during a first read cycle, the R/W control module 124 may read the data in the first storage region 105$a$ in a memory cell. In a second read cycle, the R/W control module 124 may read the data in a second storage region 105$b$ in a memory cell. The R/W control module 124 may read out contents of the storage regions as binary codes that represent stored data.

SUMMARY

A memory system includes an array of X memory cells that each includes Y storage regions. The system also includes a read module that receives a first read signal that includes a first read signal data component and a first read signal interference component from a first one of the Y storage regions. The read module also receives a second read signal from a second one of the Y storage regions. The first read signal interference component includes interference from the second one of the Y storage regions. The system also includes a data detection module that recovers the first read signal data component from the first read signal based on the second read signal and one or more of M noiseless signal estimates. M and X are integers greater than or equal to one, and Y is an integer greater than or equal to two.

In other features, the second read signal includes a second read signal data component and a second read signal interference component. The second read signal interference component includes interference from the first one of the Y storage regions. The read module generates a received signal for a first one of the X memory cells based on the first read signal and the second read signal. The data detection module includes a signal detection module that determines a distance between the received signal and a first one of the M noiseless signal estimates. The first one of the M noiseless signal estimates represents a first noiseless signal including a first noiseless signal data component and a first noiseless signal interference component and a second noiseless signal including a second noiseless signal data component and a second noiseless signal interference component. The distance includes a squared Euclidean distance.

In other features, the signal detection module determines distances between the received signal and the M noiseless signal estimates. The signal detection module identifies a second one of the M noiseless signal estimates that has a minimal distance from the received signal. The data detection module includes a data conversion module that recovers data in the first one of the X memory cells by determining a binary representation for the second one of the M noiseless signal estimates. The data corresponds to the binary representation.

In other features, the data detection module includes a subset identification module that identifies L of M noiseless signal estimates. The signal detection module determines distances between the received signal and each of the L of M noiseless signal estimates. L is an integer greater than or equal to 1, and L is less than M. The subset identification module identifies the L of M noiseless signal estimates by determining a first set of distances between the first read signal and the first noiseless signal data component. The distance corresponds to an absolute difference between the first read signal and the first noiseless signal data component.

In other features, the subset identification module identifies the L of M noiseless signal estimates by determining a second set of distances between the second read signal and the second noiseless signal data component. The subset identification module identifies the L of M noiseless signal estimates by ordering the first set of distances in ascending order and selecting V of the binary values for the first noiseless signal data component. V is an integer greater than or equal to one. The subset identification module identifies the L of M noiseless signal estimates by ordering the second set of distances in ascending order and selecting W of the binary values for the second noiseless signal data component. W is an integer greater than or equal to one.

In other features, the subset identification module identifies the L of M noiseless signal estimates by determining a product of the V binary values for the first noiseless signal data component and the W binary values for the second noiseless signal data component to yield a subset of binary values. The subset identification module identifies the L of M noiseless signal estimates by converting the subset of binary values to a subset of corresponding noiseless estimates.

In other features, a memory control module includes a read module that receives a first read signal and a second read signal respectively from a first storage region and a second storage region of a memory cell. The memory control module also includes a data detection module that generates a corrected first read signal based on the second read signal and one or more noiseless signals.

In other features, the second read signal includes a read signal data component and a read signal interference component. The read signal interference component includes interference from the first one of the first and second storage regions. The read module generates a received signal for the memory cell based on the first read signal and the second read signal. The data detection module includes a signal detection module that determines a distance between the received signal and a first one of M noiseless signal estimates. The first one of the M noiseless signal estimates represents a first noiseless signal including a first noiseless signal data component and a first noiseless signal interference component and a second noiseless signal including a second noiseless signal data component and a second noiseless signal interference component. The distance includes a squared Euclidean distance.

In other features, the signal detection module determines distances between the received signal and the M noiseless signal estimates. The signal detection module identifies a second one of the M noiseless signal estimates that has a minimal distance from the received signal. The data detection module includes a data conversion module that recovers data in the memory cell by determining a binary representation for the second one of the M noiseless signal estimates. The data corresponds to the binary representation. The data detection module includes a subset identification module that identifies L of M noiseless signal estimates.

In other features, the signal detection module determines distances between the received signal and each of the L of the M noiseless signal estimates. L and M are integers greater than or equal to 1. L is less than M. The subset identification module identifies the L of M noiseless signal estimates by determining a first set of distances between the first read signal and the first noiseless signal data component. The distance corresponds to an absolute difference between the first read signal and the first noiseless signal data component. The subset identification module identifies the L of M noiseless signal estimates by determining a second set of distances between the second read signal and the second noiseless signal data component.

In other features, the subset identification module identifies the L of M noiseless signal estimates by ordering the first set of distances in ascending order and selecting V of the binary values for the first noiseless signal data component. V is an integer greater than or equal to one. The subset identification module identifies the L of M noiseless signal estimates by ordering the second set of distances in ascending order and selecting W of the binary values for the second noiseless signal data component. W is an integer greater than or equal to one. The subset identification module identifies the L of M noiseless signal estimates by determining a product of the V binary values for the first noiseless signal data component and the W binary values for the second noiseless signal data component to yield a subset of binary values. The subset identification module identifies the L of M noiseless signal estimates by converting the subset of binary values to a subset of corresponding noiseless estimates.

In other features, a method for operating a memory system includes receiving a first read signal that includes a first read signal data component and a first read signal interference component from a first one of Y storage regions. The method also includes receiving a second read signal from a second one of the Y storage regions. The first read signal interference component includes interference from the second one of the Y storage regions. The method also includes recovering the first read signal data component from the first read signal based on the second read signal and at least one of M noiseless signal estimates. X and M are integers greater than or equal to one and Y is an integer greater than or equal to two.

In other features, the second read signal includes a second read signal data component and a second read signal interference component. The second read signal interference component includes interference from the first one of the Y storage regions. The method also includes generating a received signal for a first one of the X memory cells based on the first read signal and the second read signal. The method also includes determining a distance between the received signal and a first one of the M noiseless signal estimates. The first one of the M noiseless signal estimates represents a first noiseless signal including a first noiseless signal data component and a first noiseless signal interference component and a second noiseless signal including a second noiseless signal data component and a second noiseless signal interference component. The distance includes a squared Euclidean distance.

In other features, the method includes determining distances between the received signal and the M noiseless signal estimates. The method also includes identifying a second one of the M noiseless signal estimates that has a minimal distance from the received signal. The method also includes recovering data in the first one of the X memory cells by determining a binary representation for the second one of the M noiseless signal estimates. The data corresponds to the binary representation. The method also includes identifying L of M noiseless signal estimates and determining distances between the received signal and each of the L of M noiseless signal estimates. L is an integer greater than or equal to 1. L is less than M.

In other features, the method also includes identifying the L of M noiseless signal estimates by determining a first set of distances between the first read signal and the first noiseless signal data component. The distance corresponds to an absolute difference between the first read signal and the first noiseless signal data component. The method also includes identifying the L of M noiseless signal estimates by determining a second set of distances between the second read signal and the second noiseless signal data component. The method also includes identifying the L of M noiseless signal estimates by ordering the first set of distances in ascending order and selecting V of the binary values for the first noiseless signal data component. V is an integer greater than or equal to one.

In other features, the method includes identifying the L of M noiseless signal estimates by ordering the second set of distances in ascending order and selecting W of the binary values for the second noiseless signal data component. W is an integer greater than or equal to one. The method also includes identifying the L of M noiseless signal estimates by determining a product of the V binary values for the first noiseless signal data component and the W binary values for the second noiseless signal data component to yield a subset of binary values. The method also includes identifying the L of M noiseless signal estimates by converting the subset of binary values to a subset of corresponding noiseless estimates.

In other features, a method for operating a memory control module includes receiving a first read signal and a second read signal respectively from a first storage region and a second storage region of a memory cell. The method also includes generating a corrected first read signal based on the second read signal and one or more noiseless signals.

In other features, the second read signal includes a data component and an interference component. The interference component includes interference from the first one of the first and second storage regions. The method also includes generating a received signal for the memory cell based on the first read signal and the second read signal. The method also includes determining a distance between the received signal and a first one of M noiseless signal estimates. The first one of the M noiseless signal estimates represents a first noiseless signal including a first noiseless signal data component and a first noiseless signal interference component and a second noiseless signal including a second noiseless signal data component and a second noiseless signal interference component. The distance includes a squared Euclidean distance.

In other features, the method includes determining distances between the received signal and the M noiseless signal estimates. The method also includes identifying a second one of the M noiseless signal estimates that has a minimal distance from the received signal. The method also includes recovering data in the memory cell by determining a binary representation for the second one of the M noiseless signal estimates. The data corresponds to the binary representation. The method also includes identifying L of M noiseless signal estimates; and determining distances between the received signal and each of the L of the M noiseless signal estimates. L and M are integers greater than or equal to 1. L is less than M.

In other features, the method includes identifying the L of M noiseless signal estimates by determining a first set of distances between the first read signal and the first noiseless signal data component. The distance corresponds to an absolute difference between the first read signal and the first noiseless signal data component. The method also includes identifying the L of M noiseless signal estimates by determining a second set of distances between the second read signal and the second noiseless signal data component. The method also includes identifying the L of M noiseless signal estimates by ordering the first set of distances in ascending order and selecting V of the binary values for the first noiseless signal data component. V is an integer greater than or equal to one.

In other features, the method includes identifying the L of M noiseless signal estimates by ordering the second set of distances in ascending order and selecting W of the binary values for the second noiseless signal data component. W is an integer greater than or equal to one. The method also includes identifying the L of M noiseless signal estimates by determining a product of the V binary values for the first noiseless signal data component and the W binary values for the second noiseless signal data component to yield a subset of binary values. The method also includes identifying the L of M noiseless signal estimates by converting the subset of binary values to a subset of corresponding noiseless estimates.

In other features, a memory system includes an array of X memory cells that each includes Y storage regions. The system also includes read means for receiving a first read signal that includes first data and first interference from a first one of the Y storage regions. The read means also receives a second read signal from a second one of the Y storage regions. The first interference includes interference from the second one of the Y storage regions. The system also includes data detection means for recovering the first data from the first read signal based on the second read signal and one or more of M noiseless signal estimates. M and X are integers greater than or equal to one, and Y is an integer greater than or equal to two.

In other features, the second read signal includes second data and second interference. The second interference includes interference from the first one of the Y storage regions. The read means generates a received signal for a first one of the X memory cells based on the first read signal and the second read signal. The data detection means includes signal detection means for determining a distance between the received signal and a first one of the M noiseless signal estimates. The first one of the M noiseless signal estimates represents a first noiseless signal including a first data component and a first interference component and a second noiseless signal including a second data component and a second interference component. The distance includes a squared Euclidean distance.

In other features, the signal detection means determines distances between the received signal and the M noiseless signal estimates. The signal detection means identifies a second one of the M noiseless signal estimates that has a minimal distance from the received signal. The data detection means includes data conversion means for recovering data in the first one of the X memory cells by determining a binary representation for the second one of the M noiseless signal estimates. The data corresponds to the binary representation.

In other features, the data detection means includes a subset identification means that identifies L of M noiseless signal estimates. The signal detection means determines distances between the received signal and each of the L of M noiseless signal estimates. L is an integer greater than or equal to 1, and L is less than M. The subset identification means identifies the L of M noiseless signal estimates by determining a first set of distances between the first read signal and the first data component. The distance corresponds to an absolute difference between the first read signal and the first data component.

In other features, the subset identification means identifies the L of M noiseless signal estimates by determining a second set of distances between the second read signal and the second data component. The subset identification means identifies the L of M noiseless signal estimates by ordering the first set of distances in ascending order and selecting V of the binary values for the first data component. V is an integer greater than or equal to one. The subset identification means identifies the L of M noiseless signal estimates by ordering the second set of distances in ascending order and selecting W of the binary values for the second data component. W is an integer greater than or equal to one.

In other features, the subset identification means identifies the L of M noiseless signal estimates by determining a product of the V binary values for the first data component and the W binary values for the second data component to yield a subset of binary values. The subset identification means identifies the L of M noiseless signal estimates by converting the subset of binary values to a subset of corresponding noiseless estimates.

In other features, a memory control means for controlling memory includes read means for receiving a first read signal and a second read signal respectively from a first storage region and a second storage region of a memory cell. The memory control means also includes data detection means for generating a corrected first read signal based on the second read signal and one or more noiseless signals.

In other features, the second read signal includes a data component and an interference component. The interference component includes interference from the first one of the first and second storage regions. The read means generates a received signal for the memory cell based on the first read signal and the second read signal. The data detection means includes signal detection means for determining a distance between the received signal and a first one of M noiseless signal estimates. The first one of the M noiseless signal estimates represents a first noiseless signal including a first data component and a first interference component and a second noiseless signal including a second data component and a second interference component. The distance includes a squared Euclidean distance.

In other features, the signal detection means determines distances between the received signal and the M noiseless signal estimates. The signal detection means identifies a second one of the M noiseless signal estimates that has a minimal distance from the received signal. The data detection means includes data conversion means for recovering data in the memory cell by determining a binary representation for the second one of the M noiseless signal estimates. The data corresponds to the binary representation. The data detection means includes a subset identification means that identifies L of M noiseless signal estimates.

In other features, the signal detection means determines distances between the received signal and each of the L of the M noiseless signal estimates. L and M are integers greater than or equal to 1. L is less than M. The subset identification means identifies the L of M noiseless signal estimates by determining a first set of distances between the first read signal and the first data component. The distance corresponds to an absolute difference between the first read signal and the first data component. The subset identification means identifies the L of M noiseless signal estimates by determining a second set of distances between the second read signal and the second data component.

In other features, the subset identification means identifies the L of M noiseless signal estimates by ordering the first set of distances in ascending order and selecting V of the binary values for the first data component. V is an integer greater than or equal to one. The subset identification means identifies the L of M noiseless signal estimates by ordering the second set of distances in ascending order and selecting W of the binary values for the second data component. W is an integer greater than or equal to one. The subset identification means identifies the L of M noiseless signal estimates by determining a product of the V binary values for the first data component and the W binary values for the second data component to yield a subset of binary values. The subset identification means identifies the L of M noiseless signal estimates by converting the subset of binary values to a subset of corresponding noiseless estimates.

Further areas of applicability of the present disclosure will become apparent from the detailed description, the claims and the drawings. It should be understood that the detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Figure 1:
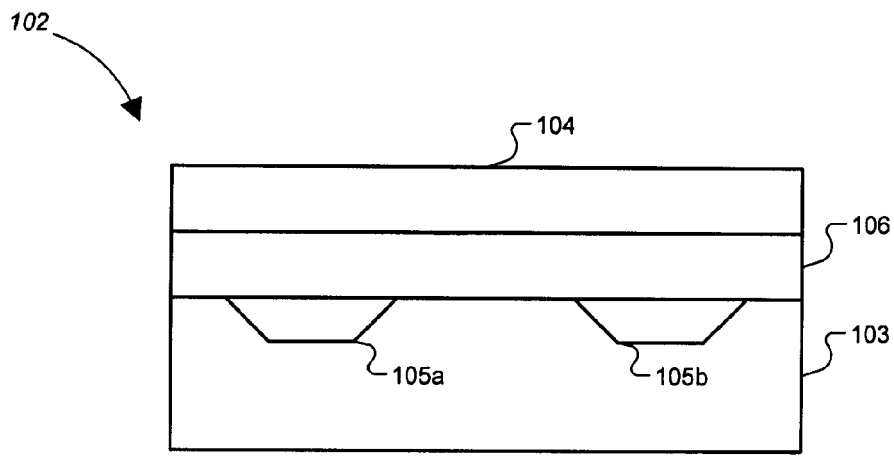
FIG. 1 is a schematic representation of a memory cell according to the prior art.
Figure 2:
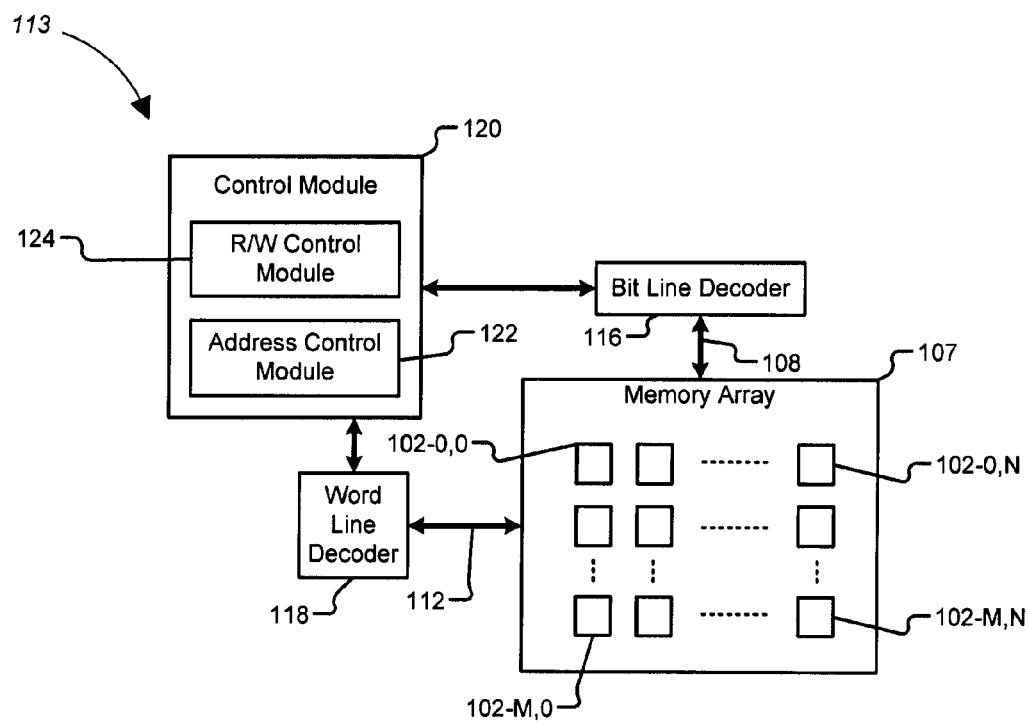
FIG. 2 is a functional block diagram of an exemplary memory system according to the prior art.
Figure 3A:
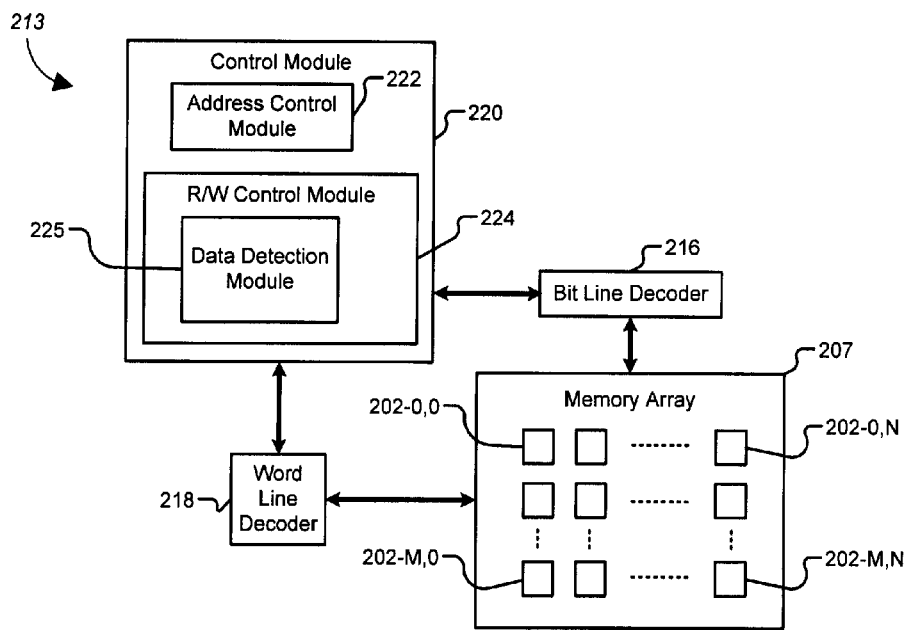
FIG. 3A is a functional block diagram of a memory system according to the present disclosure.
Figure 3B:
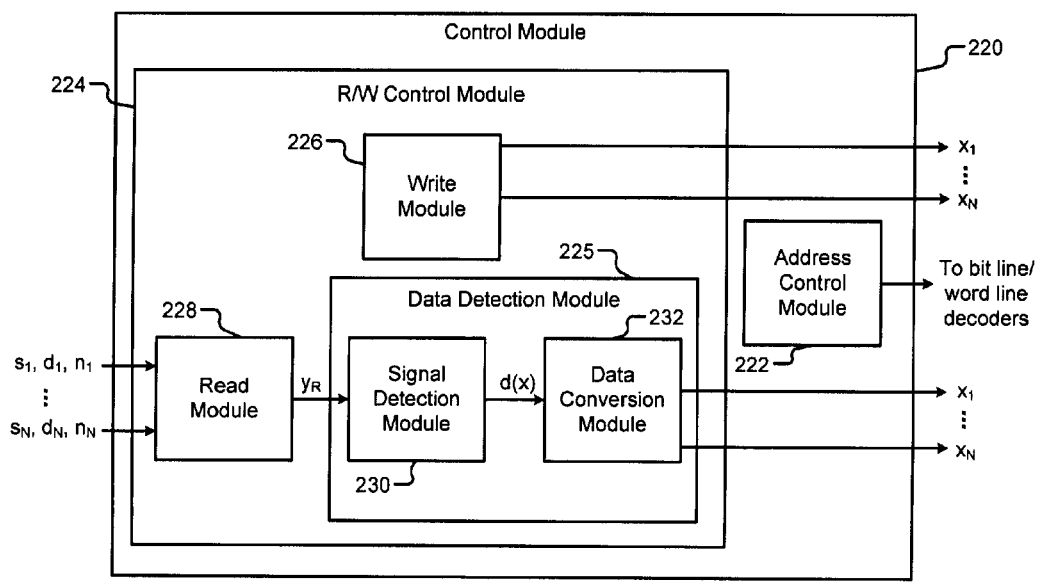
FIG. 3B is a functional block diagram of a control module according to the present disclosure.
Figure 3C:
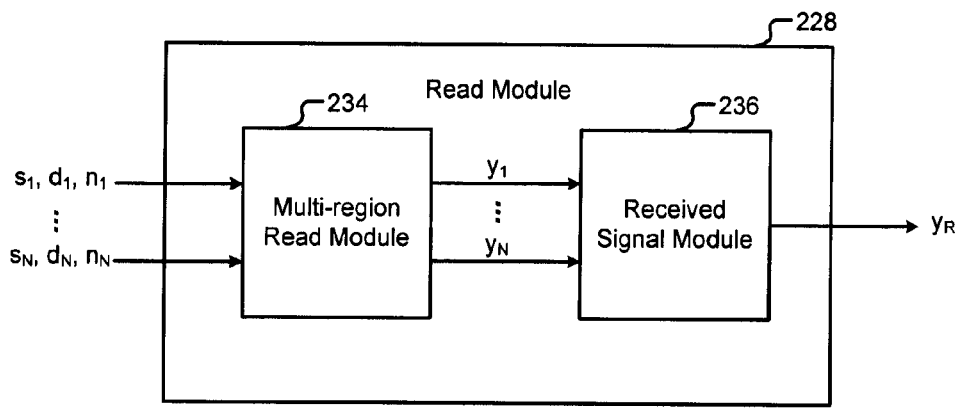
FIG. 3C is a functional block diagram of a read module according to the present disclosure.
Figure 3D:
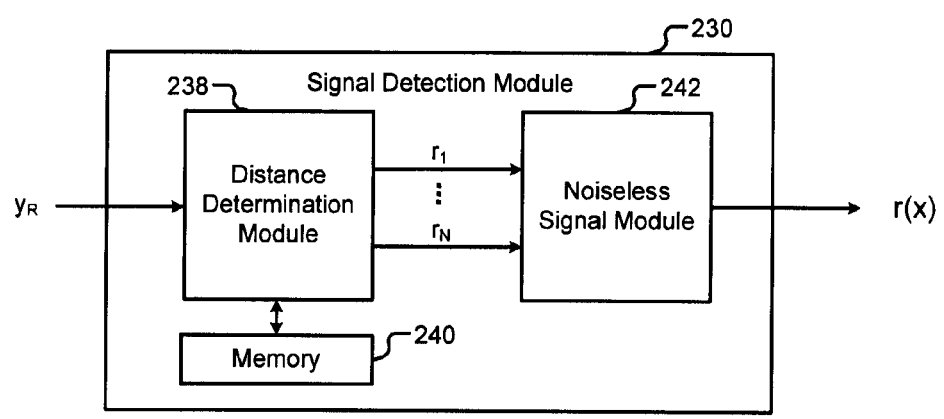
FIG. 3D is a functional block diagram of an interference detection module according to the present disclosure.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory (shared, dedicated, or group) that execute one or more software or firmware programs, a combinational logic circuit, and/or other suitable components that provide the described functionality.

Storage regions within multi-bit memory cells may be electrically isolated from each other. Nevertheless, there may be inter-region interference between storage regions, particularly as the density of memory cells and the number of bits stored in each storage region increases. Bits may be stored based on threshold voltages for the regions. Inter-region interference may cause variations in the threshold voltages, which may affect performance of read modules and/or the quality of read data. Inter-region interference may also affect the reliability of memory devices when the devices are scaled to, for example, 45 nanometers (nm) and smaller.

Inter-region interference may be based on data stored in a target storage region and data stored in neighboring storage regions. When the target storage region is read, the target storage region may receive interference from data stored in neighboring storage regions. The interference may cause variations in the threshold voltage and may thus cause the target storage region to be read incorrectly. Previously, non-volatile memory systems tended to ignore inter-region interference.

The present disclosure includes systems and methods for reading data from storage regions of memory cells, such as non-volatile flash memory cells, using a data detection module. The data detection module detects data in multiple storage regions by collectively processing signals read from multiple storage regions. The data may include inter-region interference.

Referring now to FIGS. 3A-3D and 4-6, a memory system 213 includes the data detection module 225. The data detection module 225 detects data including inter-region interference. The memory system 213 may include an array 207 of memory cells 202, a bit line decoder 216, a word line decoder 218, and a control module 220. The control module 220 may include an address control module 222 that may control addressing of the memory cells 202 via the bit line decoder 216 and the word line decoder 218. A read/write (R/W) control module 224 may include the data detection module 225, a write module 226, and a read module 228. The R/W control module 224 may control R/W operations of the memory cells 202 via the bit line decoder 216 and the word line decoder 218.

The write module 226 may write data $(x_1 \ldots x_N)$ to multiple storage regions within a memory cell, where x represents a bit of data, and N represents the number of storage regions in a memory cell. The read module 228 may include a multi-region read module 234 and a received signal module 236. The read module 228 may read signals from multiple storage regions. The signals may include an ideal and interference-free signal $s_1 \ldots s_N$ (referred to herein as ideal signals s), an interference signal $d_1 \ldots d_N$ (referred to herein as interference signals d), and a noise signal $n_1 \ldots n_N$ (referred to herein as noise signals n). The read module 228 may generate read signals $(y_1 \ldots y_N)$ for each storage region and generate a received signal $(y_R)$ for the memory cell. Further, a noiseless signal, which may be represented as $r_1 \ldots r_N$ may include the ideal signals and interference signals, so that, for example, $r_1=s_1+d_1, \ldots, r_N=s_N+d_N$.

The R/W control module 224 may execute a read cycle to access data stored in the memory cells 202. For example, during a first read cycle, the R/W control module 224 may receive data and interference in a first storage region in a memory cell. In a second read cycle, the R/W control module 224 may receive data and interference in a second storage region in a memory cell. The R/W control module 224 may recover data in the first storage region and second storage region based on interference from neighboring storage regions.

The data detection module 225 may include a signal detection module 230 and a data conversion module 232. The signal detection module 230 may include a distance determination module 238, memory 240, and a noiseless signal module 242. The signal detection module 230 may determine the distances $(D_1 \ldots D_N)$ between the received signal $(y_R)$ and estimated noiseless signals $(r_1, \ldots r_N)$ and determine the closest noiseless signal $(r(x))$ to the received signal $(y_R)$. The data conversion module 232 may detect data by converting the closest noiseless signal $(r(x))$ to a corresponding binary representation. For example, the data conversion module 232 may detect data $(x_1)$ from a first storage region and data $(x_2)$ from a second storage region, and data $(x_N)$ from an Nth storage region based on the binary representation of the closest noiseless signal $(r(x))$. Accordingly, the data conversion module 232 detects data in N storage regions within a memory cell.

Figure 4:
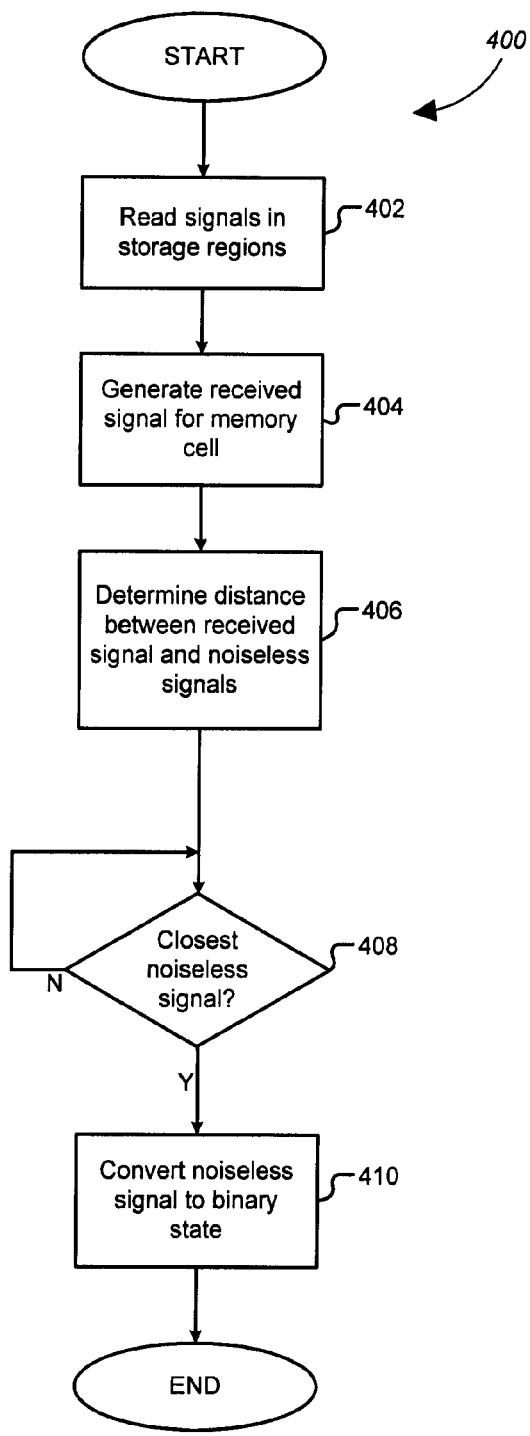
FIG. 4 is a flow chart illustrating a first data detection method according to the present disclosure.
Figure 5:
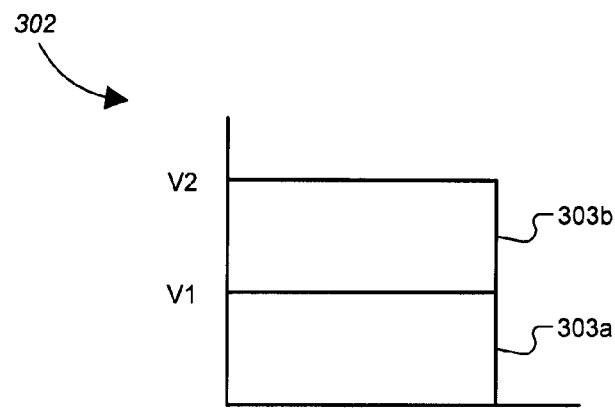
FIG. 5 is a graphical depiction of a portion of a memory cell according to the present disclosure.
Figure 6:
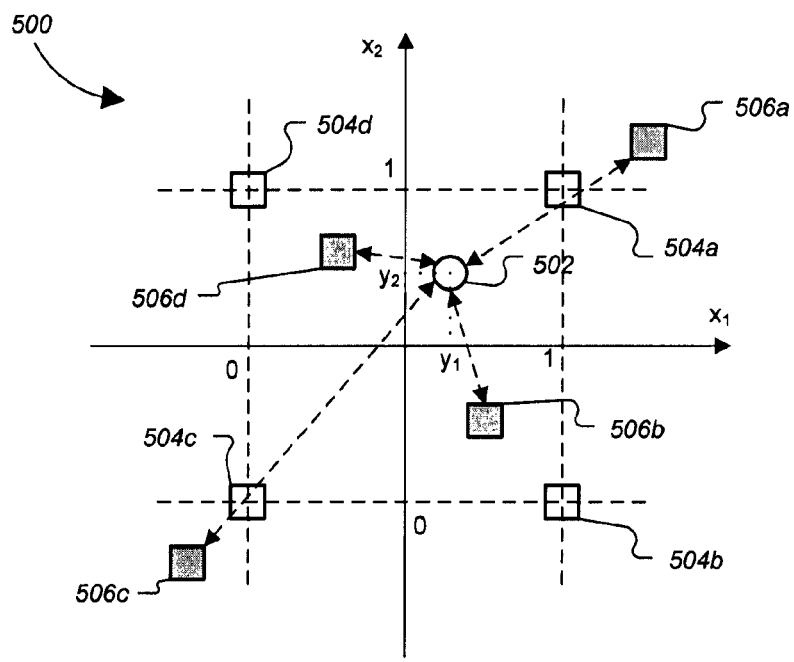
FIG. 6 is a graphical depiction of a method for detecting data in an exemplary memory cell according to the present disclosure.
Figure 7A:
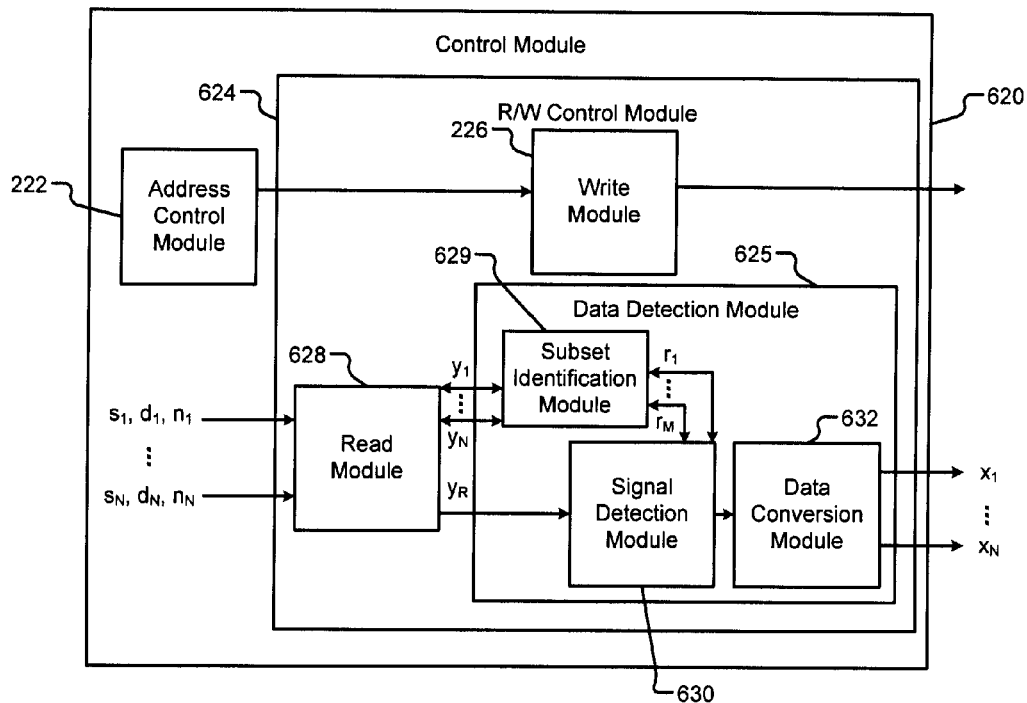
FIG. 7A is a functional block diagram of a control module according to the present disclosure.
Figure 7B:
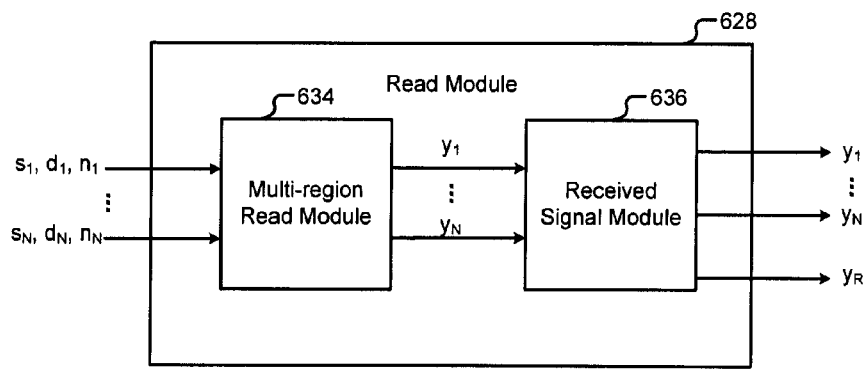
FIG. 7B is a functional block diagram of a read module according to the present disclosure.
Figure 7C:
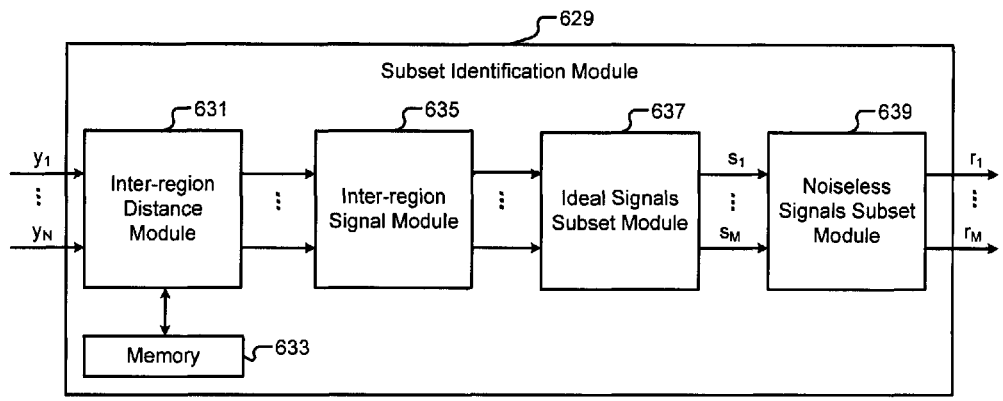
FIG. 7C is a functional block diagram of a subset identification module according to the present disclosure.
Figure 7D:
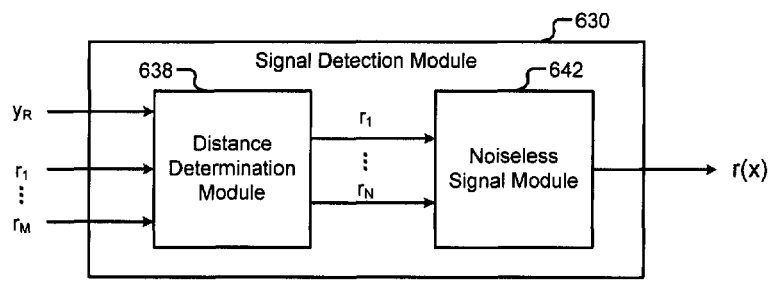
FIG. 7D is a functional block diagram of a interference detection module according to the present disclosure.

Referring now to FIGS. 4-6, a first method according to the present disclosure will be discussed with respect to an exemplary flash memory cell 302 that has two storage regions. The two storage regions may be referred to as the first storage region 303a and second storage region 303b, respectively. The first storage region 303a has a corresponding voltage V1, and the second storage region 303b has a corresponding voltage V2. Each storage region 303a, 303b may store at least one bit of data. The first method may be extended, however, to include flash memory cells having more than two storage regions that each store one or more bits of data.

In FIG. 4, a data detection method 400 including inter-region interference is illustrated. In step 402, the multi-region read module 234 may read signals from multiple storage regions. Assuming the data stored in the first storage region 303a is $x_1$ and the data stored in the second storage region 303b is $x_2$, the multi-region read module 234 may generate respective read signals $(y_1, y_2)$ for the storage regions 303a, 303b according to the following equations:

$$y_1 = s_1(x_1) + d_1(x_2) + n_1 = r_1(x_1, x_2) + n_1$$

$$y_2 = s_2(x_2) + d_2(x_1) + n_2 = r_2(x_2, x_1) + n_2.$$

$s_1(x_1)$ is the ideal signal of the first storage region 303a, $d_1(x_2)$ is interference to the first storage region 303a from data stored in the second storage region 303b, and $n_1$ includes all other noise sources affecting the first storage region 303a. Similarly, $s_2(x_2)$ is the ideal signal of the second storage region 303b, $d_2(x_1)$ is interference to the second storage region 303b from data stored in the first storage region 303a, and $n_2$ includes all other noise sources affecting the second storage region 303b. In addition, $r_1(x_1,x_2)$ and $r_2(x_2,x_1)$ correspond to the noiseless signal, which includes ideal signals and interference signals for the first storage region 303a and second storage region 303b, respectively.

If the first and second storage regions 303a, 303b of a memory cell 302 are symmetric, the equations for the read signals $(y_1, y_2)$ may be simplified as follows:

$$y_1 = s(x_1) + d(x_2) + n_1 = r(x_1, x_2) + n_1$$

$$y_2 = s(x_2) + d(x_1) + n_2 = r(x_2, x_1) + n_2,$$

where $s(x) = s_1(x) = s_2(x)$, $d(x) = d_1(x) = d_2(x)$ and $r(x,z) = s(x) + s(z)$. In step 404, the received signal module 236 generates a received signal $(y_R)$ for the memory cell 302.

In FIG. 6, a two-dimensional depiction 500 of the memory cell 302 is illustrated. The x-axis represents the data $(x_1)$ stored in the first storage region 303a, and the y-axis represents the data $(x_2)$ stored in the second storage region 303b. The two-dimensional depiction 500 shows the actual received signal 502, the ideal signals 504a-504d, and the noiseless signals 506a-506d. The received signal 502 is generated by the received signal module 236 and has an x-component that is based on the read signal $(y_1)$ from the first storage region 303a, and a y-component that is based on the read signal $(y_2)$ from the second storage region 303b. In other words, the x-component may be represented as $y_1$, and the y-component may be represented as $y_2$. The signals may therefore be graphically represented as received signal 502 having coordinates $(y_1, y_2)$.

For example, when there is one bit of data stored in the first storage region 303a, the region 303a may either store a logical 1 or logical 0. The ideal values of the data in each storage region 303a, 303b are labeled on the x-axis and y-axis. Thus, there may be four ideal binary states for every combination of data $(x_1, x_2)$ in the first storage region 303a and second storage region 303b: (0,0), (0,1), (1,0), or (1,1). For example, as shown in FIG. 6, ideal signal 504a corresponds to a binary state of (1,1), ideal signal 504b corresponds to a binary state of (1,0), ideal signal 504c corresponds to a binary state of (0,0) and ideal signal 504d corresponds to a binary state of (0,1). Due to inter-region interference, ideal signals 504a-504d may shift to exemplary points represented by noiseless signals 506a-506d. A more accurate estimation for the stored data $(x_1, x_2)$, therefore, may also be based on interference signals 506a-506d.

Assuming that the noise signals (n) are independent and identically distributed random variables according to a Gaussian distribution, an estimation for the stored data $(x_1, x_2)$ may correspond to:

$$\{x_1, x_2\} = \arg\left(\min_{x_1, x_2}([y_1 - s(x_1) - d(x_2)]^2 + [y_2 - s(x_2) - d(x_1)]^2)\right).$$

In other words, in step 406, the distance determination module 238 may determine the distance between the received signal 502 and the noiseless signals 506a-506d. The noiseless signals $(r(x_1,x_2), r(x_2,x_1))$ 506a-506d may be stored in memory 240 and may be estimated using pilot data, through an empirical model, through measurements, and/or through various other estimation methods. The distance determination module 238 may compute the squared distance between the received signal 502 and the noiseless signals 506a-506d. For example, the distance determination module 238 may compute the squared Euclidean distance, using the following equation:

$$D^2 = [y_1 - s(x_1) - d(x_2)]^2 + [y_2 - s(x_2) - d(x_1)]^2$$

Other methods may be used to determine the distance. For example, the distance determination module 238 may determine the absolute value of the distance instead of the squared distance.

Although the distance equation is shown with respect to two storage regions 303a, 303b, the equations may be extended for additional storage regions. For example, when reading data from the memory cells, additional read signals may be generated for additional storage regions. Then, when calculating the distance, one or more terms may be added, representing additional storage regions. For example, if calculating the squared Euclidean distance, an additional squared term could be added.

In step 408, the interference signal module 242 identifies the closest noiseless signal (r) to the received signal 502 based on the distance calculations from step 406. As shown in FIG. 6, the interference signal module 242 detects noiseless signal 506d as the interference signal closest to the received signal 502. In step 410, the data conversion module 232 converts the closest noiseless signal 506d to a corresponding binary representation. The data $(x_1)$ in the first storage region 303a and the data $(x_2)$ in the second storage region 303b may be estimated from the corresponding binary representation of the closest noiseless signal 506d. For example, the data conversion module 232 detects the received signal 502 as 0 in the first storage region 303a and 1 in the second storage region 303b, based on the binary representation of the closest noiseless signal 506d.

In contrast, traditional non-volatile flash memory devices that may not consider inter-region interference may merely detect the ideal signal 504a-504d that is closest to the received signal 502. Thus, traditional non-volatile flash memory devices may detect the received signal 502 as 1 in the first storage region 303a and 1 in the second storage region 303b, based on the binary representation of the closest ideal signal 504a.

In memory cells storing one bit of data per storage region, the number of potential read signals may be represented as $2^N$, where N represents the number of storage regions. For example, where there are two storage regions, there may be four potential read states: (0,0), (0,1), (1,0), (1,1). For this example, the control module 220 may compute four distances to determine the values of the data $(x_1, x_2)$ in the first and second storage regions. Where the number of bits per storage region is represented by M, the number of potential read signals may be represented as $2^{M*N}$. For example, where there are two storage regions each storing three bits of data, the number of potential read states may be $2^{3*2} = 64$. The control module 220 may therefore compute 64 distances, which may be prohibitive for many applications.

Referring now to FIGS. 7A-7D, a second data detection method may detect the data $(x_1, x_2)$ in the first storage region 303a and second storage region 303b by calculating the distance between the received signal and a subset of noiseless signals. A control module 620 including a data detection module 625 that detects data including inter-region interference is shown. The control module 620 may include an address control module 222 and a R/W control module 624. The R/W control module 624 may include a write module 226, a read module 628 and a data detection module 625.

The read module 628 of the second data detection method may include a multi-region read module 634 and a received signal module 636. The read module 628 may read signals from N storage regions and generate read signals $(y_1 \ldots y_N)$ for the storage regions 303a, 303b and a received signal $y_R$ for the memory cell 302. A subset identification module 629 may identify a subset of noiseless signals $(r_1 \ldots r_M)$ to be used by a signal detection module 630. The subset identification module 629 may include an inter-region distance module 631, memory 633, an inter-region signal module 635, an ideal signals subset module 637, and a noiseless signals subset module 639. The signal detection module 630 may include a distance determination module 638 and a noiseless signal module 642, and may determine the closest noiseless signal (r) to the received signal ($y_R$) from the subset of noiseless signals ($r_1 \ldots r_M$). A data conversion module 632 may detect data in multiple storage regions based on the binary representation of the closest noiseless signal (r).

Figure 8:
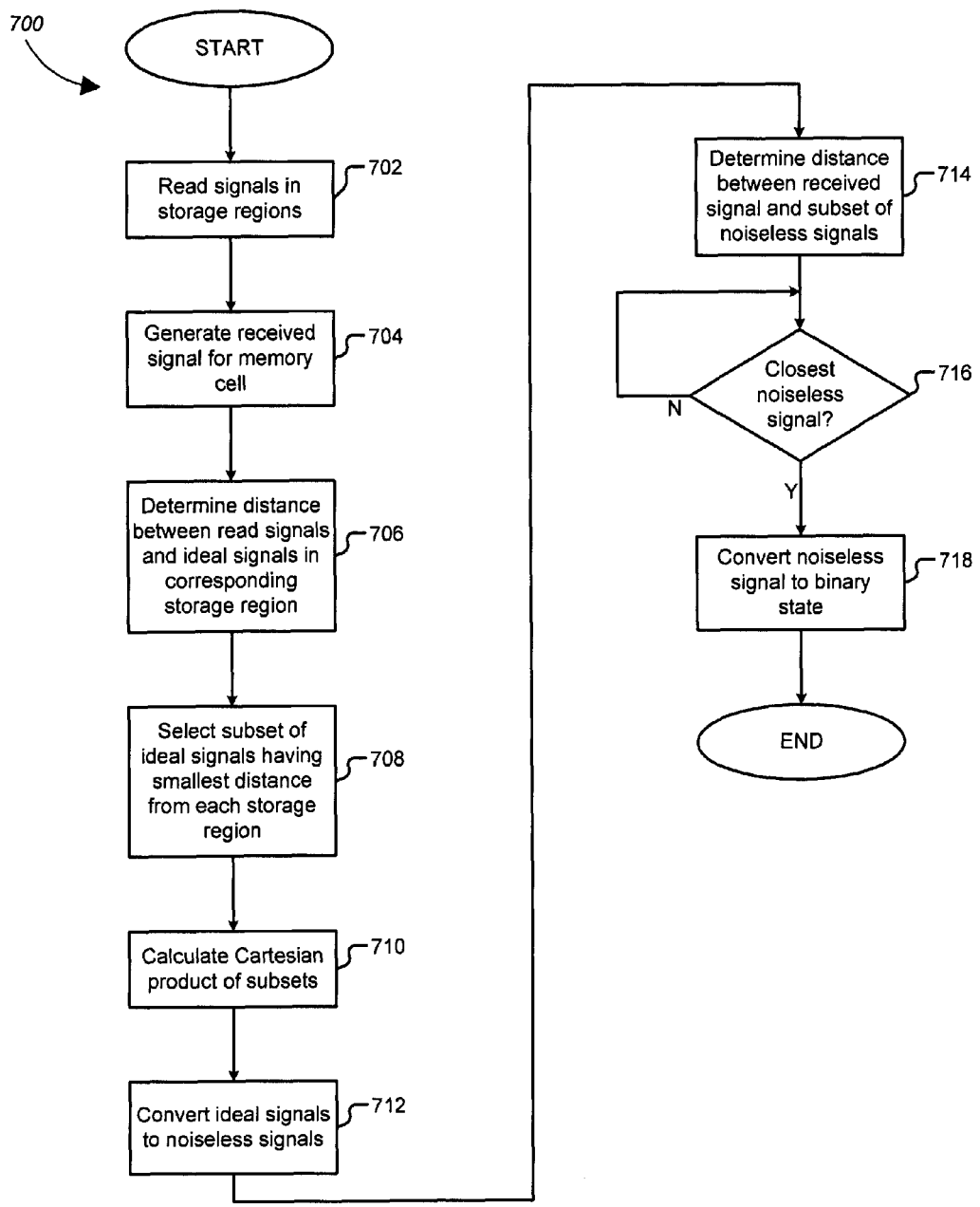
FIG. 8 is a flow chart illustrating a second data detection method according to the present disclosure.
Figure 9A:
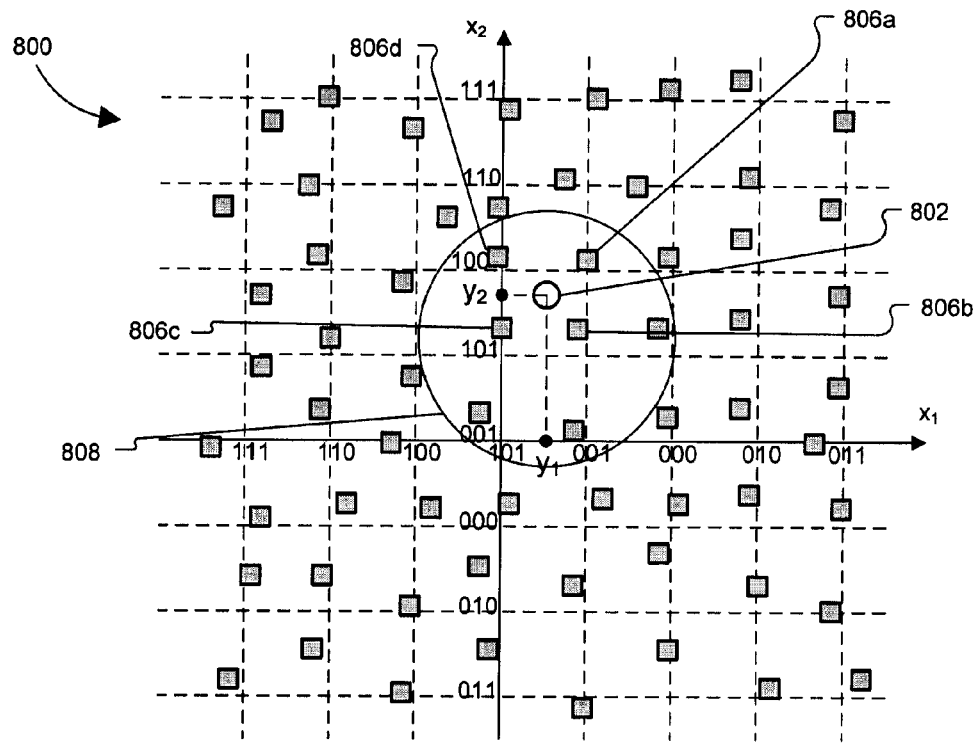
FIG. 9A is a graphical depiction of a method for detecting data in an exemplary memory cell according to the present disclosure.
Figure 9B:
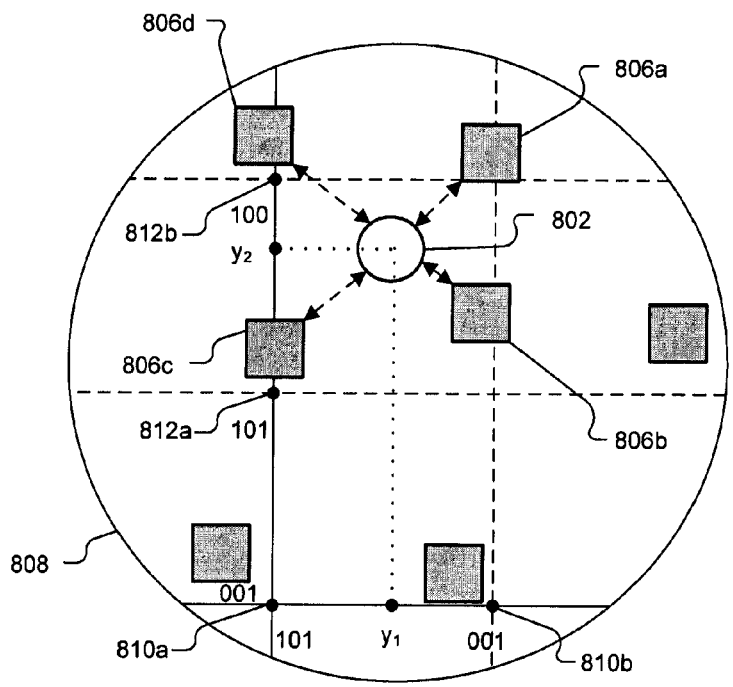
FIG. 9B is a graphical depiction of a method for detecting data in an exemplary memory cell according to the present disclosure.

Referring now to FIGS. 8 and 9A-9B, the second data detection method will now be described in more detail. FIG. 8 shows a data detection method 700 including inter-region interference. In step 702, the multi-region read module 634 may read signals from multiple storage regions. The signal may include an ideal signal (s), an interference signal (d), and/or a noise signal (n). The multi-region read module 634 may generate read signals ($y_1, y_2$) for the storage regions 303a, 303b of the memory cell 302 based on the above signals.

In step 704, the received signal module 636 generates a received signal ($y_R$) for the memory cell 302. In FIGS. 9A-9B, a two-dimensional depiction 800 of the memory cell 302 is illustrated. The memory cell 302 has two storage regions 303a, 303b, where each storage region stores three bits of data. The x-axis represents the data ($x_1$) stored in the first storage region 303a, and the y-axis represents the data ($x_2$) stored in the second storage region 303b. The two-dimensional depiction 800 shows the actual received signal 802 for the memory cell 302, a subset of noiseless signals 806a-806d and a portion of the two-dimensional depiction 808. The received signal 802 generated by the received signal module 636 has an x-component, based on the read signal ($y_1$) read from the first storage region 303a and a y-component, based on the read signal ($y_2$) read from the second storage region 303b. In other words, the x-component is based on $y_1$, and the y-component is based on $y_2$. The read signals are graphically represented as received signal 802 having coordinates ($y_1, y_2$).

For example, where there are two storage regions 303a, 303b, each storing three bits of data, there may be $2^3=8$ ideal binary states for each storage region. Thus, there may be 64 possible states for every combination of data ($x_1, x_2$) in the first and second storage regions 303a, 303b. For example, the first storage region 303a may store data ($x_1$) corresponding to one of eight ideal binary states: (000), (001), (010), (011), (100), (101), (110), or (111). The ideal binary states for each storage region are labeled on the x-axis and y-axis and represent the ideal signals (s). Due to inter-region interference, the ideal signals (s) may shift to exemplary points represented by noiseless signals 806a-806d.

Next, the distance determination module 638 may determine the distance between the received signal 802 and a subset of noiseless signals 806a-806d. The noiseless signals 806a-806d may be stored in memory 633 and may be estimated using pilot data, through an empirical model, through measurements and/or through various other estimation methods. An estimation for the stored data is:

$$\{x_1, x_2\} = \arg\min_{x_1,x_2}\left([y_1 - s(x_1) - d(x_2)]^2 + [y_2 - s(x_2) - d(x_1)]^2 \mid \{x_1, x_2\} \in A\right),$$

where A represents the subset of noiseless signals. Further, $A = A_1 \otimes A_2$ and $A_1 \subseteq B_1$, $A_2 \subseteq B_2$, where $A_1$ is a subset of states of the first storage region 303a, includes the entire set of states of the first storage region 303a, $A_2$ is a subset of states of the second storage region 303b, and $B_2$ includes the entire set of states of the second storage region 303b.

To identify the subset of noiseless signals 806a-806d, in step 706 the inter-region distance module 631 determines the distance between the read signals ($y_1 \ldots y_N$) and the ideal signals (s) in the corresponding region. For example, where there are three bits of data stored in each storage region, there may be eight states for each region: (000), (001), (010), (011), (100), (101), (110), or (111). Using the proposed second data detection method, the inter-region distance module 631 determines distances between the read signal ($y_1$) and each ideal signal (s) in the first storage region 303a. For the first storage region, the distances may be calculated according to the following equation:

$$w(x_{1,i}) = |y_1 - s(x_{1,i})|,$$

Where $w(x_{1,i})$ represents the distance between the read signal ($y_1$) in the first storage region 303a and the ith ideal signal ($s(x_{1,i})$) in the first storage region 303a. Accordingly, there may be eight distance calculations per storage region. Similar calculations may be performed for the second storage region 303b.

Referring now to FIGS. 9A-9B, the inter-region distance module 631 determines the distance of the coordinates of the received signal 802 from each of the eight ideal signals in the corresponding storage region. For example, the distance between $y_r$ and every ideal signal (s) in the first storage region 303a is determined. Similarly, the distance between $y_2$ and every ideal signal (s) in the second storage region 303b is determined.

In step 708, the inter-region signal module 635 selects a subset of ideal signals from each storage region that have the smallest distance from the read signals ($y_1, y_2$). First, the inter-region signal module 635 orders the distances in ascending order to find the ideal signals that minimize the distance from the respective read signal. For the first storage region, the ideal signals may be identified according to the following equation:

$$\tilde{B}_1 = \{\tilde{x}_{1,0}, \tilde{x}_{1,1}, \ldots, \tilde{x}_{1,2^m}\},$$

where $\tilde{B}_1$ includes a binary representation of ordered ideal signals, $\tilde{x}_{1,0}$ represents the binary state of the ideal signal that is closest to the read signal ($y_1$) in the first storage region, $\tilde{x}_{1,1}$ represents the binary state of the ideal signal that is second closest to the read signal ($y_1$) in the first storage region, and $\tilde{x}_{1,2^m}$ represents the binary state of the ideal signal that is furthest from the read signal ($y_1$) in the first storage region. Accordingly, $w(\tilde{x}_{1,i}) \leq w(\tilde{x}_{1,i+1})$ for $i=0, \ldots, 2^m-1$. $A_1$ comprises the first V elements of $\tilde{B}_1$. $A_2$ may be similarly chosen. In practice, V may be selected as two, but other numbers may be used. Where V is two, $A_1$ and $A_2$ may be given by:

$$A_1 = \{\tilde{x}_{1,0}, \tilde{x}_{1,1}\} \text{ and } A_1 = \{\tilde{x}_{1,0}, \tilde{x}_{1,1}\}.$$

As shown in FIG. 9B, the inter-region signal module 635 finds the two closest ideal signals 810a, 810b to $y_1$ on the x-axis, and the two closest ideal signals 812a, 812b to $y_2$ on the y-axis. The two closest ideal signals 810a, 810b to $y_1$ on the x-axis correspond with binary states (101) and (001), respectively. The two closest ideal signals 812a, 812b to $y_2$ on the y-axis correspond with binary states (101) and (100), respectively. Accordingly, the inter-region signal module 634 identifies a subset of ideal signals 810a, 810b for the first storage region 303a and a subset of ideal signals 812a, 812b for the second storage region 303b.

In step 710, the ideal signals subset module 637 determines the Cartesian product of the subsets of ideal signals, yielding a set of four ideal signals that are closest to the received signal 802. In step 712, the noiseless signals subset module 639 converts the subset of ideal signals to a subset of noiseless signals, which include the interference signal component, as represented in FIG. 9B by noiseless signals 806a-806d. In step 714 the signal detection module 630 may determine the distance between the received signal 802 and the subset of noiseless signals 806a-806d. The distance determination module 638 may compute the squared distance, for example squared Euclidean distance, using the following equation:

$$D^2 = [y_1 - s(x_1) - d(x_2)]^2 + [y_2 - s(x_2) - d(x_1)]^2$$

Other methods may be used to determine the distance. For example the method may determine the absolute value of the terms instead of squaring the terms.

In step 716, the noiseless signal module 642 identifies the closest noiseless signal (d(x)) to the received signal 802. As shown in FIG. 9B, the noiseless signal module 642 detects interference signal 806b as the interference signal closest to the received signal 802. In step 718, the data conversion module 632 converts the closest noiseless signal 806b to its corresponding binary representation. The data ($x_1$) in the first storage region 303a and the data ($x_2$) in the second storage region 303b may be estimated from the corresponding binary representation of the closest noiseless signal 806b. For example, the data conversion module 632 detects the data ($x_1$) in the first storage region 303a as (001) and the data ($x_2$) in the second storage region 303a as (101), based on the state of noiseless signal 806b.

In contrast, traditional non-volatile flash memory devices that may not consider inter-region interference may detect the ideal signal that is closest to the received signal 802. Thus, traditional non-volatile flash memory devices may detect the data ($x_1$) in the first storage region 303a as (001) and the data ($x_2$) in the second storage region 303b as (100), based on the state of the closest ideal signal.

Figure 10A:
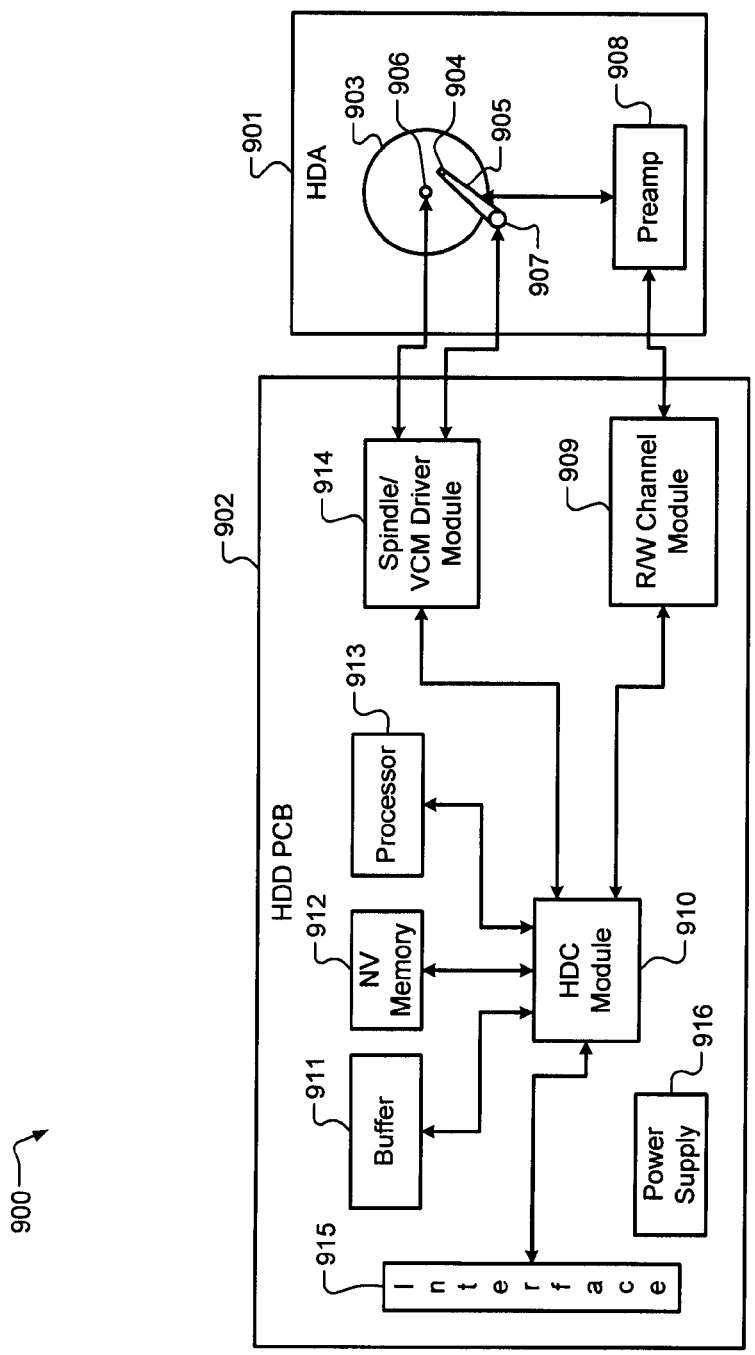
FIG. 10A is a functional block diagram of a hard disk drive.

Referring now to FIGS. 10A-10G, various exemplary implementations incorporating the teachings of the present disclosure are shown. In FIG. 10A, the teachings of the disclosure can be implemented in a control module for a non-volatile memory 912 of a hard disk drive (HDD) 900. The HDD 900 includes a hard disk assembly (HDA) 901 and an HDD printed circuit board (PCB) 902. The HDA 901 may include a magnetic medium 903, such as one or more platters that store data, and a read/write device 904. The read/write device 904 may be arranged on an actuator arm 905 and may read and write data on the magnetic medium 903. Additionally, the HDA 901 includes a spindle motor 906 that rotates the magnetic medium 903 and a voice-coil motor (VCM) 907 that actuates the actuator arm 905. A preamplifier device 908 amplifies signals generated by the read/write device 904 during read operations and provides signals to the read/write device 904 during write operations.

The HDD PCB 902 includes a read/write channel module (hereinafter, "read channel") 909, a hard disk controller (HDC) module 910, a buffer 911, nonvolatile memory 912, a processor 913, and a spindle/VCM driver module 914. The read channel 909 processes data received from and transmitted to the preamplifier device 908. The HDC module 910 controls components of the HDA 901 and communicates with an external device (not shown) via an I/O interface 915. The external device may include a computer, a multimedia device, a mobile computing device, etc. The I/O interface 915 may include wireline and/or wireless communication links.

The HDC module 910 may receive data from the HDA 901, the read channel 909, the buffer 911, nonvolatile memory 912, the processor 913, the spindle/VCM driver module 914, and/or the I/O interface 915. The processor 913 may process the data, including encoding, decoding, filtering, and/or formatting. The processed data may be output to the HDA 901, the read channel 909, the buffer 911, nonvolatile memory 912, the processor 913, the spindle/VCM driver module 914, and/or the I/O interface 915.

The HDC module 910 may use the buffer 911 and/or nonvolatile memory 912 to store data related to the control and operation of the HDD 900. The buffer 911 may include DRAM, SDRAM, etc. Nonvolatile memory 912 may include any suitable type of semiconductor or solid-state memory, such as flash memory (including NAND and NOR flash memory), phase change memory, magnetic RAM, and multi-state memory, in which each memory cell has more than two states. The spindle/VCM driver module 914 controls the spindle motor 906 and the VCM 907. The HDD PCB 902 includes a power supply 916 that provides power to the components of the HDD 900.

Figure 10B:
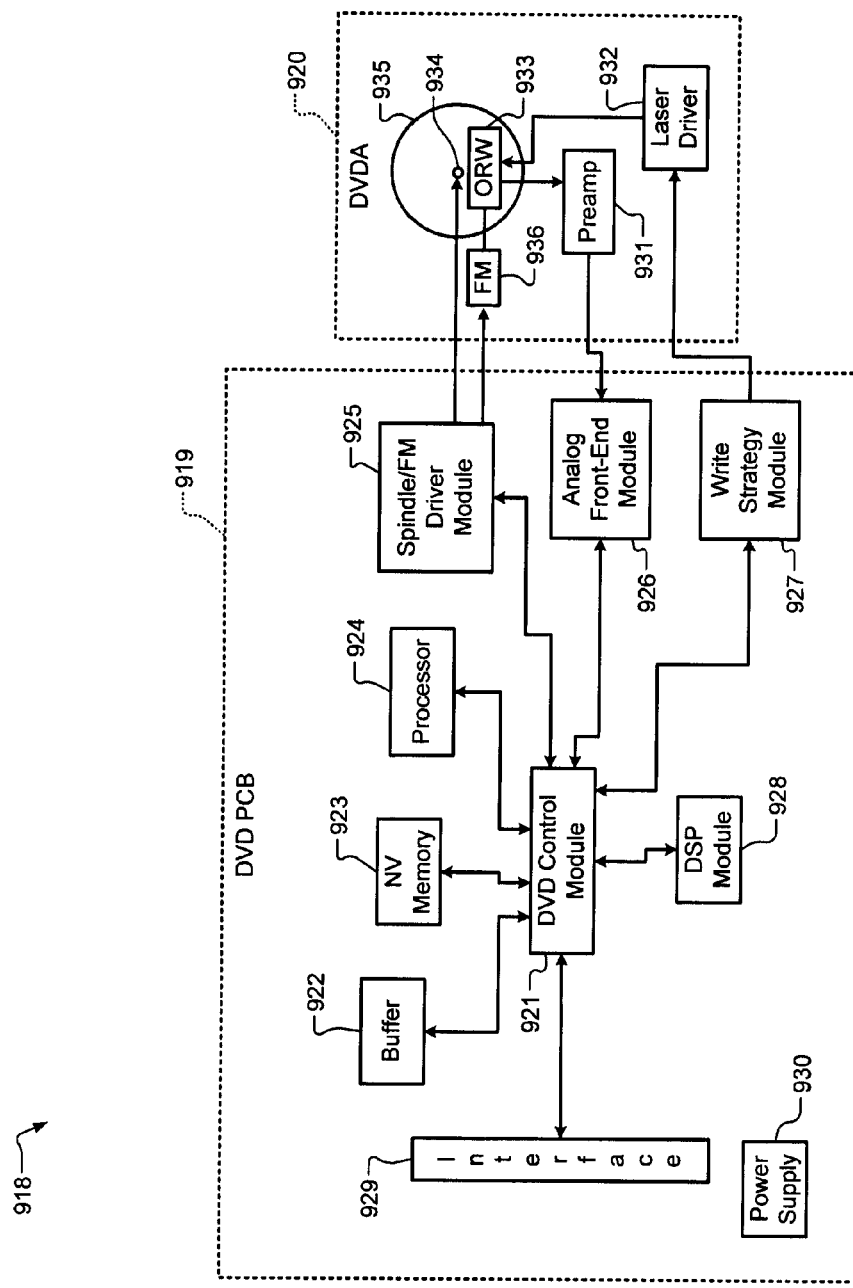
FIG. 10B is a functional block diagram of a DVD drive.

Referring now to FIG. 10B, the teachings of the disclosure can be implemented in a control module for a non-volatile memory 923 of a DVD drive 918 or of a CD drive (not shown). The DVD drive 918 includes a DVD PCB 919 and a DVD assembly (DVDA) 920. The DVD PCB 919 includes a DVD control module 921, a buffer 922, nonvolatile memory 923, a processor 924, a spindle/FM (feed motor) driver module 925, an analog front-end module 926, a write strategy module 927, and a DSP module 928.

The DVD control module 921 controls components of the DVDA 920 and communicates with an external device (not shown) via an I/O interface 929. The external device may include a computer, a multimedia device, a mobile computing device, etc. The I/O interface 929 may include wireline and/or wireless communication links.

The DVD control module 921 may receive data from the buffer 922, nonvolatile memory 923, the processor 924, the spindle/FM driver module 925, the analog front-end module 926, the write strategy module 927, the DSP module 928, and/or the I/O interface 929. The processor 924 may process the data, including encoding, decoding, filtering, and/or formatting. The DSP module 928 performs signal processing, such as video and/or audio coding/decoding. The processed data may be output to the buffer 922, nonvolatile memory 923, the processor 924, the spindle/FM driver module 925, the analog front-end module 926, the write strategy module 927, the DSP module 928, and/or the I/O interface 929.

The DVD control module 921 may use the buffer 922 and/or nonvolatile memory 923 to store data related to the control and operation of the DVD drive 918. The buffer 922 may include DRAM, SDRAM, etc. Nonvolatile memory 923 may include any suitable type of semiconductor or solid-state memory, such as flash memory (including NAND and NOR flash memory), phase change memory, magnetic RAM, and multi-state memory, in which each memory cell has more than two states. The DVD PCB 919 includes a power supply 930 that provides power to the components of the DVD drive 918.

The DVDA 920 may include a preamplifier device 931, a laser driver 932, and an optical device 933, which may be an optical read/write (ORW) device or an optical read-only (OR) device. A spindle motor 934 rotates an optical storage medium 935, and a feed motor 936 actuates the optical device 933 relative to the optical storage medium 935.

When reading data from the optical storage medium 935, the laser driver provides a read power to the optical device 933. The optical device 933 detects data from the optical storage medium 935, and transmits the data to the preamplifier device 931. The analog front-end module 926 receives data from the preamplifier device 931 and performs such functions as filtering and A/D conversion. To write to the optical storage medium 935, the write strategy module 927 transmits power level and timing data to the laser driver 932. The laser driver 932 controls the optical device 933 to write data to the optical storage medium 935.

Figure 10D:
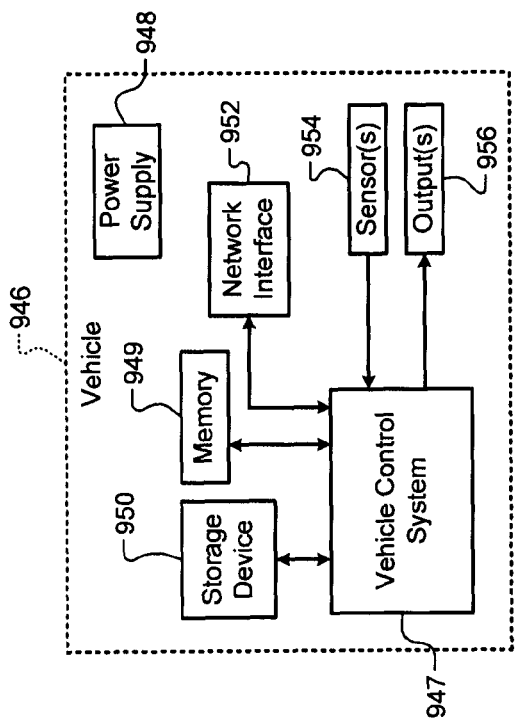
FIG. 10D is a functional block diagram of a vehicle control system.
Figure 10C:
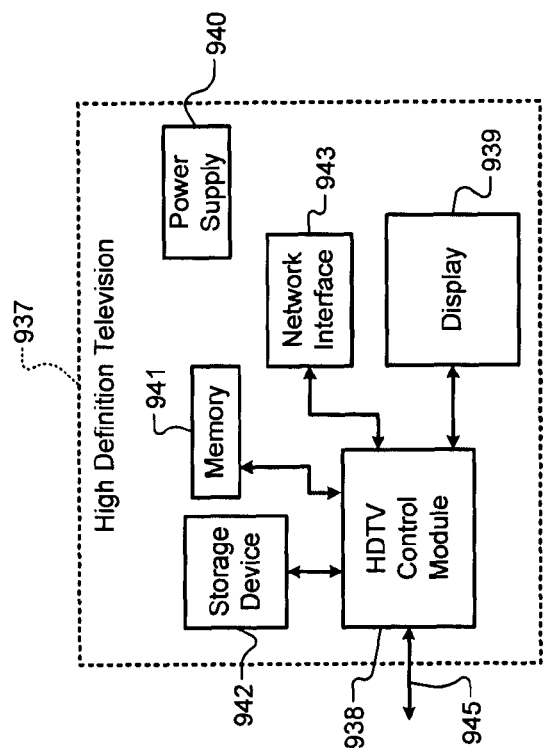
FIG. 10C is a functional block diagram of a high definition television.

Referring now to FIG. 10C, the teachings of the disclosure can be implemented in a control module for a non-volatile portion of memory 941 of a high definition television (HDTV) 937. The HDTV 937 includes an HDTV control module 938, a display 939, a power supply 940, memory 941, a storage device 942, a network interface 943, and an external interface 945. If the network interface 943 includes a wireless local area network interface, an antenna (not shown) may be included.

The HDTV 937 can receive input signals from the network interface 943 and/or the external interface 945, which can send and receive data via cable, broadband Internet, and/or satellite. The HDTV control module 938 may process the input signals, including encoding, decoding, filtering, and/or formatting, and generate output signals. The output signals may be communicated to one or more of the display 939, memory 941, the storage device 942, the network interface 943, and the external interface 945.

Memory 941 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 942 may include an optical storage drive, such as a DVD drive, and/or a hard disk drive (HDD). The HDTV control module 938 communicates externally via the network interface 943 and/or the external interface 945. The power supply 940 provides power to the components of the HDTV 937.

Referring now to FIG. 10D, the teachings of the disclosure may be implemented in a control module for a non-volatile portion of memory 949 of a vehicle 946. The vehicle 946 may include a vehicle control system 947, a power supply 948, memory 949, a storage device 950, and a network interface 952. If the network interface 952 includes a wireless local area network interface, an antenna (not shown) may be included. The vehicle control system 947 may be a powertrain control system, a body control system, an entertainment control system, an anti-lock braking system (ABS), a navigation system, a telematics system, a lane departure system, an adaptive cruise control system, etc.

The vehicle control system 947 may communicate with one or more sensors 954 and generate one or more output signals 956. The sensors 954 may include temperature sensors, acceleration sensors, pressure sensors, rotational sensors, airflow sensors, etc. The output signals 956 may control engine operating parameters, transmission operating parameters, suspension parameters, brake parameters, etc.

The power supply 948 provides power to the components of the vehicle 946. The vehicle control system 947 may store data in memory 949 and/or the storage device 950. Memory 949 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 950 may include an optical storage drive, such as a DVD drive, and/or a hard disk drive (HDD). The vehicle control system 947 may communicate externally using the network interface 952.

Figure 10F:
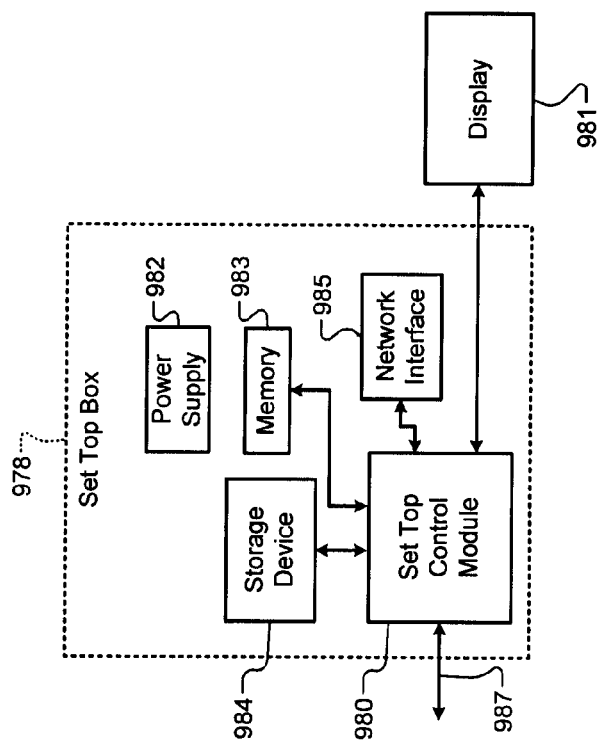
FIG. 10F is a functional block diagram of a set top box.
Figure 10E:
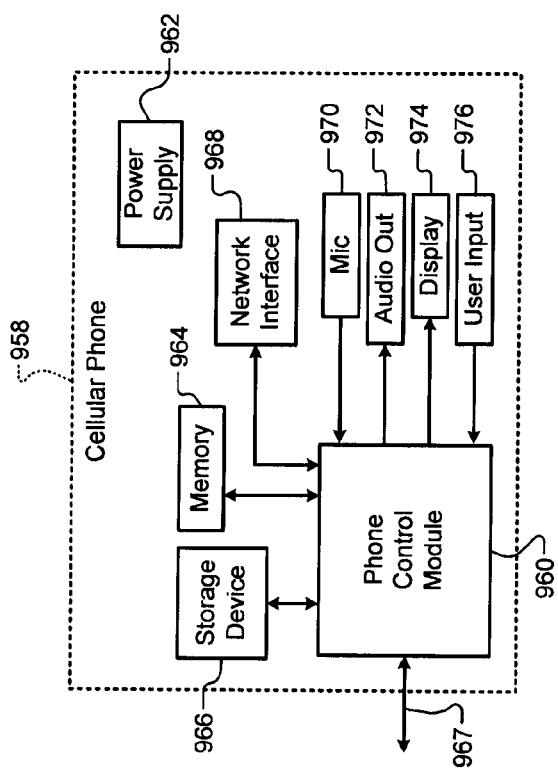
FIG. 10E is a functional block diagram of a cellular phone.

Referring now to FIG. 10E, the teachings of the disclosure can be implemented in a control module for a non-volatile portion of memory 964 of a cellular phone 958. The cellular phone 958 includes a phone control module 960, a power supply 962, memory 964, a storage device 966, and a cellular network interface 967. The cellular phone 958 may include a network interface 968, a microphone 970, an audio output 972 such as a speaker and/or output jack, a display 974, and a user input device 976 such as a keypad and/or pointing device. If the network interface 968 includes a wireless local area network interface, an antenna (not shown) may be included.

The phone control module 960 may receive input signals from the cellular network interface 967, the network interface 968, the microphone 970, and/or the user input device 976. The phone control module 960 may process signals, including encoding, decoding, filtering, and/or formatting, and generate output signals. The output signals may be communicated to one or more of memory 964, the storage device 966, the cellular network interface 967, the network interface 968, and the audio output 972.

Memory 964 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 966 may include an optical storage drive, such as a DVD drive, and/or a hard disk drive (HDD). The power supply 962 provides power to the components of the cellular phone 958.

Referring now to FIG. 10F, the teachings of the disclosure can be implemented in a control module for a non-volatile portion of memory 983 of a set top box 978. The set top box 978 includes a set top control module 980, a display 981, a power supply 982, memory 983, a storage device 984, and a network interface 985. If the network interface 985 includes a wireless local area network interface, an antenna (not shown) may be included.

The set top control module 980 may receive input signals from the network interface 985 and an external interface 987, which can send and receive data via cable, broadband Internet, and/or satellite. The set top control module 980 may process signals, including encoding, decoding, filtering, and/or formatting, and generate output signals. The output signals may include audio and/or video signals in standard and/or high definition formats. The output signals may be communicated to the network interface 985 and/or to the display 981. The display 981 may include a television, a projector, and/or a monitor.

The power supply 982 provides power to the components of the set top box 978. Memory 983 may include random access memory (RAM) and/or nonvolatile memory. Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 984 may include an optical storage drive, such as a DVD drive, and/or a hard disk drive (HDD).

Figure 10G:
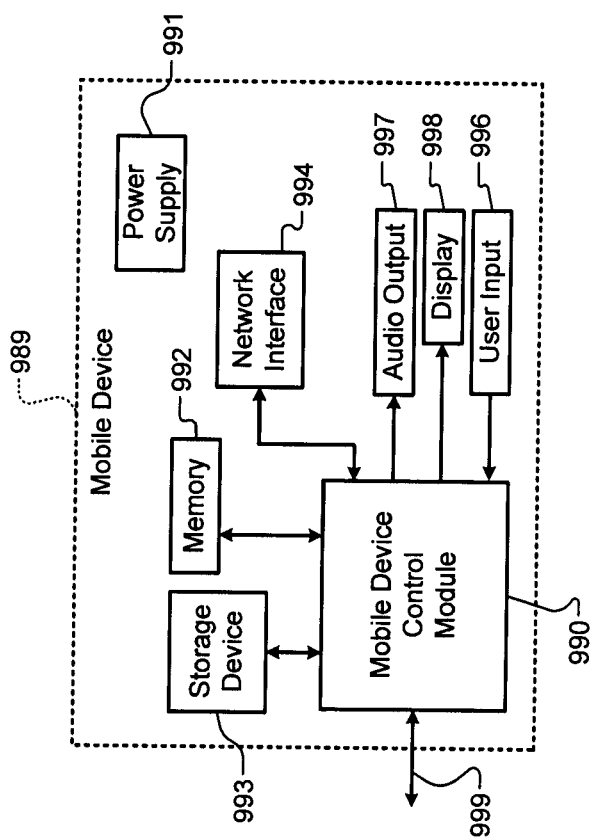
FIG. 10G is a functional block diagram of a mobile device.

Referring now to FIG. 10G, the teachings of the disclosure can be implemented in a control module for a non-volatile portion of memory 992 of a mobile device 989. The mobile device 989 may include a mobile device control module 990, a power supply 991, memory 992, a storage device 993, a network interface 994, and an external interface 999. If the network interface 994 includes a wireless local area network interface, an antenna (not shown) may be included.

The mobile device control module 990 may receive input signals from the network interface 994 and/or the external interface 999. The external interface 999 may include USB, infrared, and/or Ethernet. The input signals may include compressed audio and/or video, and may be compliant with the MP3 format. Additionally, the mobile device control module 990 may receive input from a user input 996 such as a keypad, touchpad, or individual buttons. The mobile device control module 990 may process input signals, including encoding, decoding, filtering, and/or formatting, and generate output signals.

The mobile device control module 990 may output audio signals to an audio output 997 and video signals to a display 998. The audio output 997 may include a speaker and/or an output jack. The display 998 may present a graphical user interface, which may include menus, icons, etc. The power supply 991 provides power to the components of the mobile device 989. Memory 992 may include random access memory (RAM) and/or nonvolatile memory.

Nonvolatile memory may include any suitable type of semiconductor or solid-state memory, such as flash memory (including NAND and NOR flash memory), phase change memory, magnetic RAM, and multi-state memory, in which each memory cell has more than two states. The storage device 993 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A memory control module comprising:
a read module configured to
receive a first signal read from a first storage region of a memory cell, and
receive a second signal read from a second storage region of the memory cell; and
a data detection module configured to, based on a noiseless signal, detect respective data in each of the first storage region and the second storage region, wherein the noiseless signal includes an ideal signal and an interference signal associated with at least one of the first signal and the second signal.

2. The memory control module of claim 1, wherein
the first signal read from the first storage region of the memory cell comprises a first data component and a first interference component,
the second signal read from the second storage region of the memory cell comprises a second data component and a second interference component, and
the first interference component comprises interference from the second storage region.

3. The memory control module of claim 2, wherein
the data detection module comprises a signal detection module configured to determine a distance between a third signal and a first one of a plurality of noiseless signal estimates,
the first one of the plurality of noiseless signal estimates represents
a first noiseless signal including a first noiseless signal data component and a first noiseless signal interference component, and
a second noiseless signal including a second noiseless signal data component and a second noiseless signal interference component, and
the third signal is based on the first read signal and the second read signal.

4. The memory control module of claim 3, wherein the distance includes a squared Euclidean distance.

5. The memory control module of claim 3, wherein:
the data detection module comprises a data conversion module configured to recover the respective data in the in the first storage region and the second storage region by determining a binary representation for a second one of the plurality of noiseless signal estimates; and
the data corresponds to the binary representation.

6. The memory control module of claim 3, wherein:
the data detection module comprises a subset identification module configured to identify a subset of the plurality of noiseless signal estimates; and
the signal detection module is configured to determine distances between the third signal and each of the subset of the plurality of noiseless signal estimates.

7. A method for operating a memory control module comprising:
receiving a first signal read from a first storage region of a memory cell, and a second signal read from a second storage region of the memory cell; and
based on a noiseless signal, detecting respective data in each of the first storage region and the second storage region, wherein the noiseless signal includes an ideal signal and an interference signal associated with at least one of the first signal and the second signal.

8. The method of claim 7, wherein
the first signal read from the first storage region of the memory cell comprises a first data component and a first interference component,
the second signal read from the second storage region of the memory cell includes a second data component and a second interference component, and
the first interference component comprises interference from the second storage region.

9. The method of claim 8, further comprising generating a third signal for the memory cell based on the first signal and the second signal.

10. The method of claim 9, further comprising:
determining a distance between the third signal and a first one of a plurality of noiseless signal estimates,
wherein the first one of the plurality of noiseless signal estimates represents
a first noiseless signal including a first noiseless signal data component and a first noiseless signal interference component, and
a second noiseless signal including a second noiseless signal data component and a second noiseless signal interference component.

11. The method of claim 10, further comprising determining distances between the third signal and the plurality of noiseless signal estimates.

12. The method of claim 10, further comprising identifying a second one of the plurality of noiseless signal estimates that has a minimal distance from the third signal.

13. The method of claim 12, further comprising:
recovering the respective data in the first storage region and the second storage region by determining a binary representation for the second one of the plurality of noiseless signal estimates,
wherein the data corresponds to the binary representation.

14. The method of claim 10, further comprising:
identifying a subset of the plurality of noiseless signal estimates; and
determining distances between the third signal and each of the subset of the plurality of noiseless signal estimates.

15. The method of claim 14, further comprising identifying the subset of the plurality of noiseless signal estimates by determining a first set of distances between the first signal and the first noiseless signal data component.

16. The method of claim 15, further comprising identifying the subset of the plurality of noiseless signal estimates by determining a second set of distances between the second signal and the second noiseless signal data component.

17. The method of claim 15, further comprising:
identifying the subset of the plurality of noiseless signal estimates by ordering the first set of distances in ascending order; and
selecting a plurality of binary representations for the first noiseless signal data component.

18. The method of claim 17, further comprising:
identifying the subset of the plurality of noiseless signal estimates by ordering the second set of distances in ascending order; and
selecting a plurality of binary representations for the second noiseless signal data component.

19. The method of claim 18, further comprising identifying the subset of the plurality of noiseless signal estimates by determining a product of the plurality of the binary representations for the first noiseless signal data component and the plurality of the binary representations for the second noiseless signal data component to yield a subset of binary representations.

20. The method of claim 19, further comprising identifying the subset of the plurality of noiseless signal estimates by converting the subset of binary representations to a subset of corresponding noiseless estimates.

* * * * *